(12) United States Patent
May et al.

(10) Patent No.: US 7,030,695 B2
(45) Date of Patent: Apr. 18, 2006

(54) LOW THRESHOLD VOLTAGE CIRCUIT EMPLOYING A HIGH THRESHOLD VOLTAGE OUTPUT STAGE

(75) Inventors: Marcus W. May, Austin, TX (US); Matthew D. Felder, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 10/675,115

(22) Filed: Sep. 30, 2003

(65) Prior Publication Data

US 2005/0001682 A1    Jan. 6, 2005

Related U.S. Application Data

(60) Provisional application No. 60/484,556, filed on Jul. 2, 2003.

(51) Int. Cl.
*H03F 3/45* (2006.01)
*H03F 3/26* (2006.01)

(52) U.S. Cl. .................... 330/253; 330/255; 330/273
(58) Field of Classification Search ............... 330/253, 330/260, 263, 273, 255
See application file for complete search history.

(56) References Cited

U.S. PATENT DOCUMENTS

| | | | | |
|---|---|---|---|---|
| 4,749,956 A | * | 6/1988 | Torelli et al. ................. 330/253 |
| 5,187,386 A | * | 2/1993 | Chang et al. ................. 327/537 |
| 5,631,606 A | * | 5/1997 | Tran ............................ 330/253 |
| 6,788,142 B1 | * | 9/2004 | Li et al. ...................... 330/253 |
| 2005/0001681 A1 | * | 1/2005 | Chen .......................... 330/253 |

* cited by examiner

*Primary Examiner*—Patricia Nguyen
(74) *Attorney, Agent, or Firm*—Garlick Harrison & Markison LLP; Timothy W. Markison

(57) ABSTRACT

An amplifier circuit uses low threshold voltage devices for mid rail response in low voltage applications, but uses a high threshold voltage device at an output stage of the amplifier to generate an output from the amplifier.

20 Claims, 2 Drawing Sheets

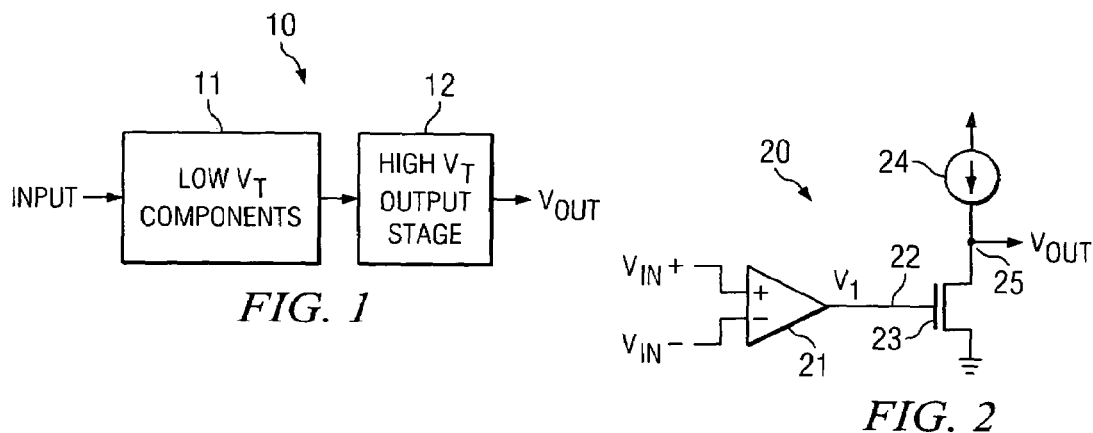
FIG. 1
FIG. 2
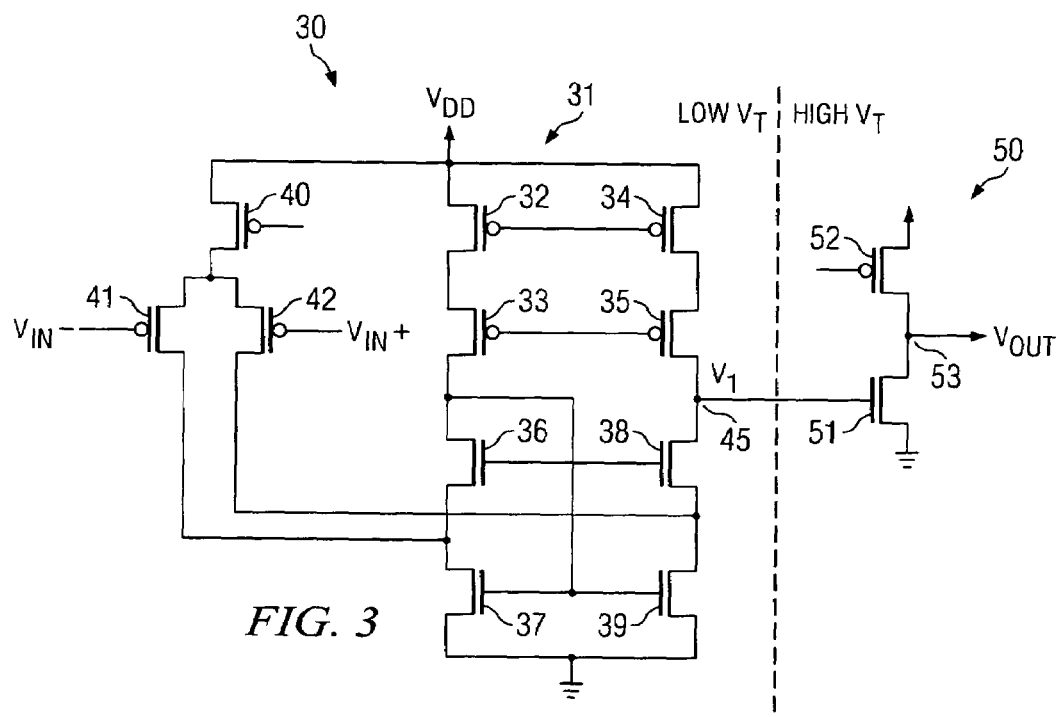
FIG. 3
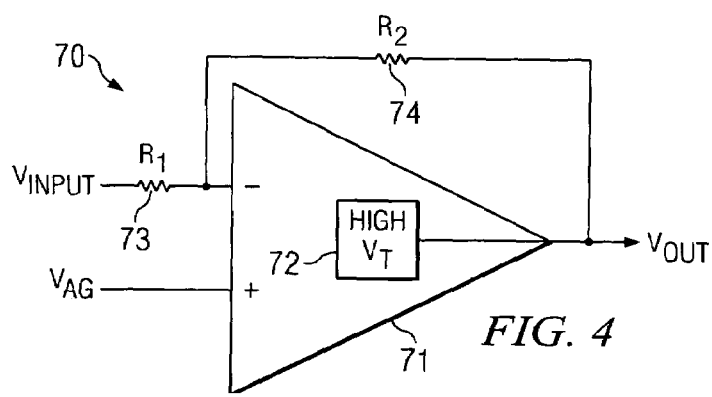
FIG. 4

LOW THRESHOLD VOLTAGE CIRCUIT EMPLOYING A HIGH THRESHOLD VOLTAGE OUTPUT STAGE

CROSS REFERENCE TO RELATED APPLICATION

This application claims the benefit of U.S. Provisional Patent Application Ser. No. 60/484,556; filed Jul. 2, 2003; and titled "Low Threshold Voltage Circuit Employing A High Threshold Voltage Output Stage."

BACKGROUND OF THE INVENTION

1. Technical Field of the Invention

The embodiments of the invention relate to integrated circuits and, more particularly, to an output stage of an amplifier.

2. Description of Related Art

In the design of various integrated circuit components, the choice of selecting a particular characteristic for the component depends on many factors. For example, when an amplifier is designed for an integrated circuit, the components (such as transistors) comprising the amplifier have properties designed into them based on desired characteristics for the integrated circuit. One of these electrical properties is the voltage selected to power the components of the amplifier.

Since today's integrated circuits are designed with power consumption in mind, many transistor circuits are now designed to utilize lower supply (also referred to as rail) voltages. The lower supply voltage allows the integrated circuit to consume much less power. The signal levels may be correspondingly smaller as well in relation to the supply voltage. In many instances it may be desirable that the transistors drop as little voltage as possible to reduce power consumption. Accordingly, in a situation where a lower supply voltage is being utilized, it may be desirable for the transistors to have low voltage drop across the junctions. That is, the transistors may be designed to have a low threshold voltage ($V_T$) to operate in the lower rail voltage environment.

Generally, different $V_T$ devices are optimized for different voltage ranges. High $V_T$ devices may be used in circuits, such as chip I/O (input/output), and tolerate higher voltages. Low $V_T$ devices may be used for high-speed lower voltage (and lower power and area) applications in the internal circuitry of the chip. Therefore, low voltage devices with low $V_T$ are desirable for analog applications, because the supply voltage may be less and less power may be consumed. However, the use of low $V_T$ device may make some circuits difficult to implement.

For example, in an amplifier where the transistors are operating in saturation (where $V_{DS} > V_{GS} - V_T$), there is a minimum value for $V_{DS}$ for the circuit to operate properly. Where multiple transistors are involved, the $V_{GS} - V_T$ value may need to have a higher value over all process corners. Also, to keep current flowing at the output stage, the gate-to-source voltage $V_{GS}$ should be above a $V_T$. Combining these factors, it is difficult to achieve this over all process corners with a thin gate, low $V_T$ device. One solution is to implement an intermediate level shifting stage(s). However, this level shifting stage at the output is a limiting factor in reducing supply voltage.

SUMMARY OF THE INVENTION

An amplifier circuit in which a low threshold voltage stage is used, wherein active load components of the low threshold voltage stage have a low threshold voltage value. The low threshold voltage stage is followed by a high threshold voltage stage. The high threshold voltage stage has an active component that operates with a high threshold voltage. In one application, the low threshold voltage stage operates at a lower supply rail voltage, but the following high threshold voltage stage allows for higher signal swing at the output. In one embodiment, the threshold voltage characteristics of the components are obtained by having different oxide thicknesses.

BRIEF DESCRIPTION OF THE SEVERAL VIEWS OF THE DRAWINGS

FIG. 1 is a block schematic diagram illustrating an embodiment of the invention in which a low threshold voltage circuit or device has a high threshold voltage output stage.

FIG. 2 is a circuit schematic diagram showing one implementation of the circuit/device diagram of FIG. 1.

FIG. 3 is a more detailed schematic diagram of the circuit of FIG. 3.

FIG. 4 is an embodiment of a low threshold voltage operational amplifier implementing a high threshold voltage output stage.

DETAILED DESCRIPTION OF THE EMBODIMENTS OF THE INVENTION

Figure 5:
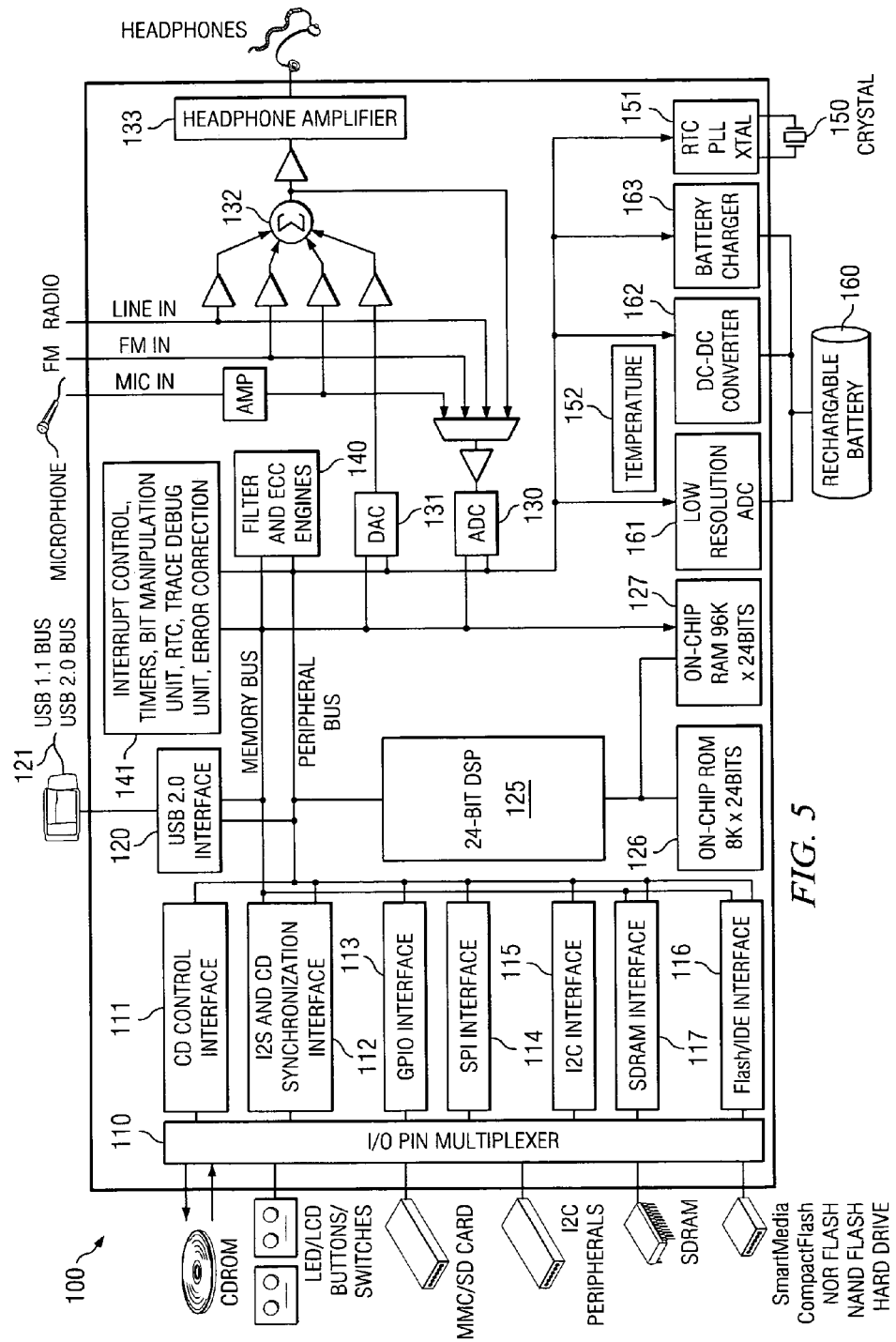
FIG. 5 is a block schematic diagram of an example integrated circuit chip operating as an audio system on a chip.

The embodiments of the present invention may be practiced in a variety of settings in which low threshold voltage ($V_T$) components are implemented on an integrated circuit chip. In the following description, references are made to low threshold voltage components or devices and high $V_T$ components and devices. The actual value of the threshold voltage for low $V_T$ and high $V_T$ devices vary depending on the component, the process utilized to manufacture the component, voltages applied to the circuit, etc., as well as other parameters. Generally, $V_T$ values will depend on the device, such as a transistor, but are within a specified range for a component. Accordingly, the comparison of the threshold voltages of a low $V_T$ device versus a high $V_T$ device is a matter of relative difference. Thus, low $V_T$ devices have lower $V_T$ values as compared to high $V_T$ devices in a particular application environment.

Referring to FIG. 1, a block schematic diagram illustrates one embodiment of the invention. In FIG. 1, block diagram 10 represents a device or a circuit which resides within an integrated circuit (IC) chip. The device or circuit represented by diagram 10 may be comprised of one of a variety of circuit components. The device/circuit is comprised of low $V_T$ components 11, such as transistors, including Field Effect Transistors (FETs), which provide a particular operation, such as amplification. An output stage of the device/circuit is comprised of a high $V_T$ output stage 12. An output from the high $V_T$ stage 12 is noted as $V_{OUT}$. That is, the device or circuit is comprised of low $V_T$ components 11 which provide a circuit operation, but instead of generating the output utilizing low $V_T$ components, the output of the low $V_T$ components 11 are sent to the high $V_T$ output stage 12 and $V_{OUT}$ is then obtained from the output stage 12.

Referring to FIG. 2, one embodiment for implementing the device/circuit diagram 10 of FIG. 1 is shown in an amplifier circuit 20. Amplifier circuit 20 is comprised of a low $V_T$ amplification stage 21 and a high $V_T$ output transistor 23. In the particular embodiment shown in FIG. 2, low $V_T$ amplification stage 21 is an operational transconductance amplifier (OTA), comprised of transistors having low threshold voltages. The input to the amplifier is noted as $V_{IN}+$ and $V_{IN}-$. The output from OTA stage 21 at node 22 is noted as voltage V1. Node 22 is coupled to the gate of transistor 23. In the embodiment of FIG. 2, a current source 24 represents the current source to the drain of transistor 23. The output $V_{OUT}$ is derived at node 25, which is also at the drain of the transistor 23. Accordingly, transistor 23 operates as the output stage 12 of FIG. 1 and separates the low $V_T$ OTA stage 21 from the output node 25. Generally, the output voltage $V_{OUT}$ at node 25 is coupled to a load, such as a subsequent stage operably coupled to receive $V_{OUT}$.

In this particular embodiment of FIG. 2, the transistors of the low threshold OTA stage 21 obtain low $V_T$ characteristics by having thin gate oxide thickness. The high $V_T$ transistor 23 derives the higher $V_T$ characteristic by having thick gate oxide thickness. Again, since the low and high designations are relative, it may be better stated that the transistors comprising the OTA stage 21 have thinner gate oxide thickness than the gate oxide thickness of transistor 23. The actual oxide thickness difference will depend on a number of factors, including the particular manufacturing process used.

In one embodiment using 0.18 micron process technology, an NMOS (N-channel metal oxide semiconductor) transistor has a $V_T$ of approximately 0.51 volts, while the thick gate NMOS transistor 23 has a threshold voltage of approximately 0.79 volts. These relative threshold differentials are obtained in one embodiment by having the gate oxide thickness of approximately 41 angstroms for the low $V_T$ transistors and approximately 68 angstroms oxide thickness for the thick gate transistor 23. If an embodiment of amplifier circuit 20 is implemented in PMOS (P-channel MOS) technology, the thin gate transistor $V_T$ is approximately 0.51 volts, but the thick gate PMOS transistor $V_T$ is approximately 0.67 volts. Again, it is to be appreciated that these values are provided as example embodiments of implementing the invention and that actual values will vary with other embodiments.

FIG. 3 is an enlarged and more detailed schematic diagram 30 of the amplifier circuit 20 of FIG. 2. The output stage of FIG. 2 is shown as output stage 50 in FIG. 3. P-channel transistors 40, 41 and 42 comprise the biasing current source and the input differential pair for an OTA stage 31. P-channel transistors 32, 33, 34, 35 and N-channel transistors 36, 37, 38, 39 form the active load of the OTA stage 31. The output of the OTA stage 31 is at node 45 and is shown as voltage $V_1$. Voltage $V_1$ is coupled to output stage 50 comprised of P-channel transistor 52 and N-channel transistor 51. The output $V_{OUT}$ is obtained at node 53 at the junction of the drains of transistors 51 and 52. Essentially, transistor 52, in this example, is operating as the current source 24 of FIG. 2.

With this example embodiment, transistors 40, 41, 42, 32, 33, 34, 35, 36, 37, 38 and 39 are low $V_T$ transistors. That is, the gate oxide thickness is of such thickness that the $V_T$ of these transistors are in the lower range for N-channel and P-channel transistors, respectively. The output transistor 51 is a high $V_T$ transistor by virtue of having its gate oxide of sufficient thickness so that the $V_T$ of the transistor 51 is in the higher range for such transistors or at least higher than the oxide thickness for the transistors of OTA amplifier 31. Transistor 52 may be a high $V_T$ device or a low $V_T$ device, depending on the particular design or application.

As noted in the Background section, generally different $V_T$ devices are optimized for different voltage ranges. High $V_T$ devices may be used in circuits, such as chip I/O (input/output), and tolerate higher voltages. Low $V_T$ devices may be used for high-speed lower voltage (and lower power and area) applications in the internal circuitry of the chip. Therefore, low voltage devices with low $V_T$ are desirable applications where the supply voltage may be lower.

With the circuit of FIG. 3, the transistors of stage 31 are in a cascode (or stacked) arrangement. It is typically important for cascode transistors to have low $V_T$, because the stacked transistors of stage 31 operate in saturation within the supply rail, $V_{DD}$. However, output stage 50 may have a high $V_T$ device, since it is cascaded.

Referring to FIG. 4, one example implementation of an embodiment of the invention is shown. In this embodiment, analog amplifier 70 is comprised of an amplifier stage 71 having low $V_T$ components. An output stage 72 of the analog amplifier 71 is comprised of a component or components having high $V_T$, or the threshold voltage is at least higher than the threshold voltage of the other components of amplifier 71. An input, noted as $V_{INPUT}$, is coupled to the negative input of the amplifier through a resistor 73 (also noted as $R_1$). An analog ground ($V_{AG}$) is coupled to the positive input of the amplifier 71. A feedback of the output voltage $V_{OUT}$ is coupled back to the negative input of the amplifier 71 through a feedback resistor 74 (also noted as resistor $R_2$). Thus, analog amplifier 71, having low $V_T$ components but a high $V_T$ output stage, operates as a typical operational amplifier. It is to be noted that the various embodiments described above are examples only and that many other embodiments may be implemented to practice the invention.

A number of advantages are derived by having a high $V_T$ output stage to a low $V_T$ circuit. Typically, a low $V_T$ device allows the use of lower rail voltages (such as supply voltage $V_{DD}$). Similarly, high $V_T$ devices typically require higher rail voltages due to the higher threshold voltage being dropped across the transistor. Thus, circuits employing low $V_T$ devices may operate from lower rail voltages. In one embodiment the rail voltage may operate at 1.56 volts. In another embodiment the rail voltage may be 1.35 volts and still in other embodiments the rail voltage may be less than 1 volt.

However, having all low $V_T$ devices within a circuit may have drawbacks as was noted above. Biasing may be difficult to maintain near the middle of the rail voltage and its return. Mid-rail operation is desired, since it allows substantially equal headroom to both P-type and N-type transistors. Accordingly, the output voltage of the amplifier (such as the described OTA amplifier) is set by the $V_{GS}$ of the N-channel transistor of the output stage (such as transistor 51 of FIG. 3). Attempting to do this adjustment with a low $V_T$ device usually results in excessive current and, thus higher power consumption. Thus, low $V_T$ devices used alone may require some other adjustment, such as the use of a level shifter. With the high $V_T$ output stage, biasing may be provided without such level shifting.

When the output stage is maintained as a single transistor, only a single Vgs (e.g. from transistor 51) sets the direct current (DC) voltage bias on node 45. This reduces the variations that may enter due to stacked threshold voltages when multiple transistors are involved, such as in the case when level shifters may need to be employed to set the DC bias. In the embodiments described above, a single transistor having a high $V_T$ value may be used to set the DC bias near mid-rail to improve the signal swing of the output voltage $V_{OUT}$.

As noted above, the difference in the threshold voltage values is obtained by adjusting the thickness of the transistor gate oxide in the low $V_T$ stage and/or the high $V_T$ output stage. However, it is to be noted that other techniques may be employed to obtain the different $V_T$ values between the two portions of the circuit. In some embodiments, the same oxide thickness may be employed but other differences, such as material or doping differences, may be employed to obtain different $V_T$ values. Thus, the invention is not limited to obtaining different $V_T$ values for the transistors strictly by adjusting the thickness of the gate oxide.

It is to be noted that various embodiments of the invention may be employed in a variety of integrated circuit chips. One example embodiment is illustrated in FIG. 5. Referring to FIG. 5, an example integrated circuit (IC) 100 is shown in which one embodiment of the invention is implemented within IC 100. The example IC 100 is a single IC chip that implements a complete audio system. It is to be noted that the example embodiment of FIG. 5 implements a complete audio system on a single chip, but other embodiments of the invention may incorporate one or more integrated circuit chips to provide a complete system or parts of a system.

As illustrated in FIG. 5, a variety of blocks are noted within the confines of IC 100. The various blocks exemplify hardware components, software and interfaces resident within IC 100. The example audio system of IC 100 may operate with one or a variety of devices, as illustrated in FIG. 5. Accordingly, a CD (compact disc); LED (Light Emitting Diode)/LCD (Liquid Crystal Display) displays, buttons and/or switches; MMC (Multimedia Card)/SD (Secure Digital) cards; I2C peripherals; SmartMedia, Compact Flash, NOR Flash, NAND Flash, and/or hard drive devices; and memory, such as SDRAM (Synchronized Dynamic Random Access Memory) are some components that may be coupled to IC 100 through an I/O (input/output) pin multiplexer 110, as is illustrated in FIG. 5. These various multiplexed connections are coupled to respective interfaces, as shown in FIG. 5. These interfaces include CD control interface 111; I2S and CD synchronization interface 112; GPIO (General Purpose Input/Output) interface 113, SPI (Serial Peripheral Interface) interface 114; I2C interface 115; Flash/IDE (Integrated Device Electronics) interface 116; and SDRAM (synchronous dynamic random access memory) interface 117.

Furthermore, a USB 2.0 interface 120 allows the coupling of a USB connection external to the IC 100. In the particular embodiment shown, USB 2.0 interface 120 is compatible with the USB 2.0 and backward compatible to a USB 1.1 protocol. A microphone input, radio input and a line input are also available on IC 100 to allow interconnection to a microphone, radio, or other audio input.

The core of IC 100 is a DSP (Digital Signal Processor) 125, which in this embodiment is a 24-bit DSP. An on-chip ROM (Read Only Memory) 126 and an on-chip RAM (Random Access Memory) 127 operate as memory for DSP 125. An analog-to-digital converter (ADC) 130 allows for analog inputs to be converted to digital format for processing by DSP 125. Similarly, a digital-to-analog converter (DAC) 131 is present to convert digital signals to analog signals for output in analog form. In this instance, amplified signals through a summation node 132 and headphone amplifier 133 generate an amplified analog signal output external to IC 100. For example, the analog output may be operably coupled to a set of headphones. Also included within IC 100 is a filter and ECC (Error Correction Circuit) engines 140 to provide filtering and error correction operations. Other functions are shown within block 141 to provide various control and timing functions. These may include Interrupt Control, Timers, Bit Manipulation Unit, Real Time Clock (RTC), Trace Debug Unit, and error correction just to name a few of the operations.

Also within IC 100 is a RTC PLL (Real Time Clock/Phase Locked loop circuit 151, which is coupled to an external crystal 150 to provide an accurate clocking signal for circuits of IC 100. Memory and peripheral buses are also present within IC 100 for transfer of data and signals. A temperature sensor circuit 152 is present to monitor the temperature of the IC 100.

In FIG. 5, a rechargeable battery 160 is shown coupled to a low resolution ADC 161, DC-DC converter 162 and battery charger 163. ADC 161 monitors the battery voltage to determine if the battery voltage is such that the battery requires charging or if the battery is fully charged. ADC 161 may also monitor the battery voltage to determine if a battery is present. Thus, if the battery is not present or is removed during use, IC 100 detects the absence of the battery through the monitoring provided by ADC 161. The DC-DC converter 162 converts the battery voltage to an operative voltage utilized by components of the IC 100. Battery charger 163 is utilized to charge the battery when an external voltage source is coupled to the IC 100.

A variety of batteries may be utilized for battery 160 and, as noted above, battery 160 is a rechargeable battery. In one particular embodiment, the rechargeable battery is a Nickel Metal Hydride (NiMH) battery. It is to be noted that various other batteries may be utilized, including alkaline cells and lithium ion (LiON) batteries. Generally, battery 160 provides a voltage in the range of 0.9 to 3.6 volts to IC 100. In the instance where a NiMH battery is used, the typical range is 0.9 to 1.25 volts. Since the voltage from the battery may vary, and/or the circuitry may require voltages other than what is provided by the battery, the DC-DC converter 162 provides conversion of the battery voltage to one or more voltages utilized on IC 100. In some embodiments, converter 162 may provide more than one DC conversion from the battery. For example, in one embodiment a NiMH battery of 0.9 to 1.25 volts may provide nominal chip voltage of 3.3 volts to the load. In another a combination of 3.3 volts and 1.8 volts are provided to the load.

The IC 100 is designed to also operate from other external power sources, when such power sources are coupled to the IC 100. One of the power sources may be provided through the USB 2.0 interface 120. The USB 2.0 protocol specifies the transfer of data by the use of differential data lines through a USB link, such as bus 121. The data is generally provided on a differential lines (D+ and D– lines). The USB 2.0 protocol also specifies the presence of a +5 volt DC voltage through bus 121 through VBUS and ground (GND) connections. Thus, an external power source having a voltage of +5 volts may be used as a power source for IC 100 through the USB 2.0 interface 120 when bus 121 is coupled to IC 100. In this instance, a USB host provides the 5 volts, while IC 100 operates as a USB device coupled to the USB host. IC 100 then may use the 5 volts to power components or circuitry on IC 100 provided the various USB specification requirements are met. In the particular embodiment of FIG. 5, when bus 121 is coupled to IC 100, the 5 volts from the USB host powers the internal circuitry, instead of the battery 160. The charger 163 uses the 5 volts from the USB host to also charge the battery 160.

In one embodiment, the low-$V_T$ amplification/high-$V_T$ output combination may be utilized in variety of locations. For example, in one embodiment, amplifiers feeding into the mixer (summation node 132), the mixer itself, microphone input amplifier, headphone amplifier 133 and the multiplexer/amplifier feeding ADC 130 may utilize the low-$V_T$ amplification/high-$V_T$ output design. It is to be noted that other circuits may implement the low-$V_T$/high-$V_T$ design as well.

We claim:

1. An apparatus comprising:
    a low threshold voltage stage powered via a first power supply voltage, wherein active load components of the low threshold voltage stage have a first threshold voltage value; and
    a high threshold voltage stage to receive a signal output from the low threshold voltage stage and to generate its output, wherein an active component of the high threshold voltage stage has a second threshold voltage value which is higher in magnitude than the first threshold voltage value, wherein the high threshold voltage stage is powered via a second power supply voltage, and wherein the second supply voltage is greater than the first power supply voltage, and wherein the high threshold voltage stage provides a bias for the low threshold voltage stage.

2. The apparatus of claim 1, wherein the active load components of the low threshold voltage stage are cascoded.

3. The apparatus of claim 2, wherein the active component of the high threshold voltage stage is cascaded to the low threshold voltage stage.

4. The apparatus of claim 3, wherein the low threshold voltage stage is an operational transconductance amplifier.

5. The apparatus of claim 3, wherein the active load components of the low threshold voltage stage derive lower threshold voltage value by having their gate oxide thickness less than gate oxide thickness of the active component of the high threshold voltage stage.

6. An amplifier comprising:
    a low threshold voltage amplifier stage, wherein active load components of the low threshold voltage stage have a lower threshold voltage characteristic to operate at a lower supply rail voltage; and
    a high threshold voltage amplifier stage to receive a signal output from the low threshold voltage amplifier stage and to generate its output, wherein an active component of the high threshold voltage amplifier stage has higher threshold voltage characteristic than the components of the low threshold voltage amplifier stage, wherein the high threshold voltage amplifier provides a bias for the low threshold voltage amplifier.

7. The amplifier of claim 6, wherein the active load components of the low threshold voltage amplifier stage are cascoded and operate in saturation within the lower supply rail voltage.

8. The amplifier of claim 7, wherein the active component of the high threshold voltage amplifier stage is cascaded to the cascoded low threshold voltage amplifier stage.

9. The amplifier of claim 8, wherein the active component of the high threshold voltage amplifier stage is a single transistor to allow for only a single transistor gate-to-source voltage to set a direct current (DC) bias point at output of the low threshold voltage amplifier stage.

10. The amplifier of claim 6, wherein the active load components of the low threshold voltage amplifier stage have their gate oxide thickness less than gate oxide thickness of the active component of the high threshold voltage amplifier stage.

11. The amplifier of claim 6, wherein the high threshold voltage amplifier stage operates at a higher supply rail voltage than the low threshold voltage amplifier stage.

12. The amplifier of claim 6, wherein the low threshold voltage amplifier stage is an operational transconductance amplifier.

13. An integrated circuit comprising:
    a plurality of audio amplifiers, wherein each of the amplifiers:
        (a) a low threshold voltage amplifier stage, wherein active load components of the low threshold voltage stage have a lower threshold voltage characteristic to operate at a lower supply rail voltage; and
        (b) a high threshold voltage amplifier stage to receive a signal output from the low threshold voltage amplifier stage and to generate its output, wherein, an active component of the high threshold voltage amplifier stage has higher threshold voltage characteristic than the components of the low threshold voltage amplifier stage, wherein the high threshold voltage amplifier stage provides a bias to the low threshold voltage amplifier stage.

14. The integrated circuit of claim 13, wherein the active load components of the low threshold voltage amplifier stage are cascoded and operate in saturation within the lower supply rail voltage.

15. The integrated circuit of claim 14, wherein the active component of the high threshold voltage amplifier stage is cascaded to the cascoded low threshold voltage amplifier stage.

16. The integrated circuit of claim 15, wherein the active component of the high threshold voltage amplifier stage is a single transistor to allow for only a single transistor gate-to-source voltage to set a direct current (DC) bias point at output of the low threshold voltage amplifier stage.

17. The integrated circuit of claim 15, wherein the active load components of the low threshold voltage amplifier stage have their gate oxide thickness less than gate oxide thickness of the active load component of the high threshold voltage amplifier stage.

18. A method comprising:
    utilizing a lower supply rail voltage on components of an amplifier having a low threshold voltage level characteristic to operate the components in a cascoded arrangement;
    utilizing a higher supply rail voltage on a last stage of the amplifier to obtain a higher signal swing output from the amplifier, the higher supply rail voltage utilized on a last stage component having a higher threshold level characteristic than the cascoded components of the amplifier; and
    providing a bias voltage from the last stage of the amplifier to the components of the amplifier.

19. The method of claim 18, wherein utilizing the higher supply rail voltage is achieved on a last stage component that has a single transistor gate-to-source voltage to set a direct current (DC) bias point at output of low threshold voltage components of the amplifier.

20. The method of claim 18 further including amplifying an audio signal through the amplifier.

* * * * *